Nov. 10, 1970 AKIO YAMASHITA 3,539,401

METHOD OF MANUFACTURING MECHANO-ELECTRICAL TRANSDUCER

Filed May 15, 1967

INVENTOR

BY

ATTORNEY

United States Patent Office 3,539,401

Patented Nov. 10, 1970

3,539,401

METHOD OF MANUFACTURING MECHANO-ELECTRICAL TRANSDUCER

Akio Yamashita, Ikeda-shi, Japan, assignor to Matsushita Electric Industrial Co., Ltd., Osaka, Japan, a corporation of Japan Filed May 15, 1967, Ser. No. 638,279

Claims priority, application Japan, May 25, 1966, 41/34,352

Int. Cl. H01l 7/34, 7/54

U.S. Cl. 148—1.5 1 Claim

ABSTRACT OF THE DISCLOSURE

A method of manufacturing a mechano-electrical transducer, in which after a semiconductor body provided on the surface thereof an impurity which forms a deep impurity level or levels in the forbidden band of said semiconductor body has been exposed to radiation to such a degree that the body does not fuse, the impurity is thermally diffused into the semiconductor body.

This invention relates to a method of manufacturing a mechano-electrical transducer in which the electrical resistance varies with pressure, and more particularly to such a method characterized by providing onto the surface of a semiconductor body an impurity which forms a deep impurity level or levels in the forbidden band of said semiconductor body, exposing the semiconductor body to radiation to such a degree that the semiconductor body is not fused, and thereafter causing the impurity to thermally diffuse into the semiconductor body.

The present inventor previously invented a mechano-electrical transducer in which the electrical resistance varies with pressure, and this transducer is manufactured by introducing into the semiconductor body an impurity which forms a deep impurity level or levels in the semiconductor body.

For a semiconductor body of silicon or germanium, such an impurity may be Au, Cu, Co, Ni, Fe, Zn or the like or a mixture of any of them, and there have been found other impurities suitable for other semiconductors.

Such impurity is introduced into the semiconductor through thermal diffusion, or during the formation of a semiconductor single crystal.

The electrical resistance of such a semiconductor can be changed by applying a pressure to at least one of two or more electrical connections provided on the semiconductor. In this type of mechano-electrical transducer, it is preferable that the variation in the electrical resistance with pressure is as great as possible. Conventionally, however, a deep impurity level or levels are formed through the thermal diffusion of the impurity into the semiconductor as described above.

The inventor has found through various experiments that by attaching to the surface of the semiconductor an impurity which forms a deep impurity level or levels, thereafter exposing the semiconductor to radiation and causing the impurity to thermally diffuse thereinto, the sensitivity of such mechano-electrical transducer is greatly enhanced, thus resulting in a greater rate of variation in the electrical resistance of such transducer with pressure.

Figure 1:
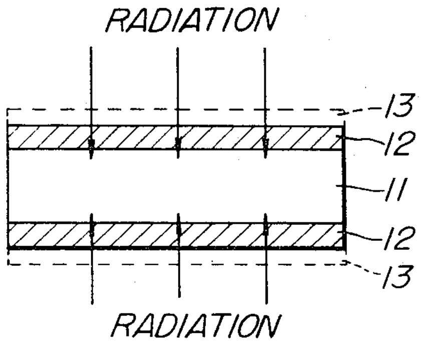
Figure 2:
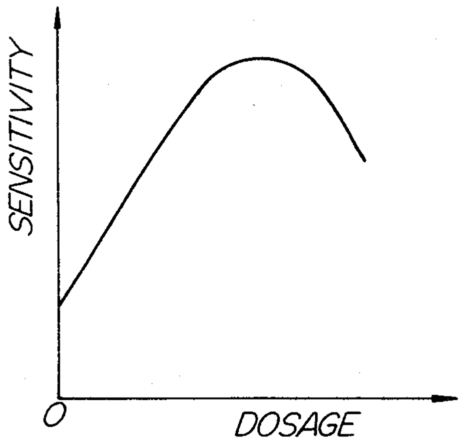

The invention will be described in greater detail with respect to an embodiment thereof as shown in the accompanying drawings, in which:

FIG. 1 is a view illustrating the method of manufacturing a mechano-electrical transducer according to the present invention; and FIG. 2 is a graph illustrating the change in the sensitivity of such transducer in terms of dosage.

Referring now to FIG. 1, there is shown a semiconductor body 11 having an impurity 12 provided thereon which forms a deep impurity level or levels.

After being exposed to radiation as shown by the arrows in FIG. 1, the semiconductor body 11 is heated. Thus the impurity 12 is caused to diffuse into the semiconductor body 11. The radiation to be used may be an electron beam, a neutron beam or the like with an intensity in such a range that the semiconductor body 11 is not fused thereby.

After the semiconductor body 11 has been subjected to the radiaton and the impurity 12 has been diffused into said semiconductor body 11, electrodes designated by reference numeral 13 are provided on the opposite sides of the semiconductor body 11. In this case, the impurity forming the deep impurity forming the deep impurity level or levels may be diffused into the semiconductor body after the body has been irradiated on one side only. Whether the semiconductor body is irradiated on one side only or both sides of the body may depend upon the intended purpose of the transducer. Electrical connections may be ohmic or non-ohmic and can be formed in the known manner.

The sensitivity of the thus constructed mechano-electrical transducer under a definite pressure varies with the dose of the radiation and has its maximum value as shown in FIG. 2.

Now a preferred embodiment of this invention will be described in detail. As the semiconductor body, use was made of a single crystal piece of Si having a resistivity of 1Ω-cm. and an etch-pit density lower than 10. Copper was plated on this single crystal piece and then a electron beam under an acceleration voltage of 50 kv. was directed thereonto in a vacuum for 1000 seconds. Thereafter, diffusion was effected in a hydrogen atmosphere at 1000° C. for 30 minutes, and subsequently Au (0.8% Sb) was alloyed so as to form electrodes. The thus produced mechano-electrical transducer has its electrical resistance greatly varied by a slight pressure applied thereto.

FIG. 2 illustrates the change in the sensitivity in terms of dosage. From this, it will be seen that the sensitivity is higher in the case where the semiconductor body is irradiated than in the case where it is not irradiated, and that the sensitivity reaches a maximum at a suitable value of dosage.

In the case of Si, such a maximum value of the sensitivity was reached when an electron beam of 10 $\mu$a. under 50 kv. was directed thereonto for 1000 seconds. A dosage in excess of a certain value caused Si to be fused, and such dosage should be avoided in working this invention. This is true of other semiconductors to be used, but this invention is equally applicable to such semiconductors as Ge, GaAs, GaP and the like.

From the foregoing, it will be seen that in accordance with this invention, a mechano-electrical transducer can be produced in which electrical resistance is greatly varied by applying a slight pressure ($10^2$–$10^4$ g./cm.$^2$) thereto.

Thus this invention provides such transducer with an enhanced sensitivity and therefore it is advantageous in respect of industrial utility.

What is claimed is:

1. A method of manufacturing a mechano-electrical transducer, characterized by providing on the surface of a semiconductor body selected from the group consisting of monocrystalline silicon and germanium at least one kind of impurity which forms at least one deep impurity level in the forbidden band of said semiconductor body, irradiating said semiconductor body with a corpuscular radiation to a degree insufficient to fuse said body, thereafter causing said impurity to thermally diffuse into said semiconductor body, and providing at least two electrical connections to said semiconductor body.

References Cited

UNITED STATES PATENTS

| | | | |
|---|---|---|---|
| 2,964,689 | 12/1960 | Buschert et al. ----- | 148—188 X |
| 3,132,408 | 5/1964 | Pell -------------- | 148—188 X |

L. DEWAYNE RUTLEDGE, Primary Examiner

R. A. LESTER, Assistant Examiner

U.S. Cl. X.R.

29—25.35, 576, 577, 592, 595, 610; 148—186, 188